(12) United States Patent
Yokogawa

(10) Patent No.: US 6,816,995 B2
(45) Date of Patent: Nov. 9, 2004

(54) METHOD OF DESIGNING INTERCONNECTS

(75) Inventor: Shinji Yokogawa, Kanagawa (JP)

(73) Assignee: NEC Electronics Corporation ( * ) Notice: Subject to any disclaimer, the term of this patent is extended or adjusted under 35 U.S.C. 154(b) by 0 days.

(21) Appl. No.: 10/440,194

(22) Filed: May 19, 2003

(65) Prior Publication Data
US 2003/0226121 A1 Dec. 4, 2003

(30) Foreign Application Priority Data

May 29, 2002 (JP) ........................................ 2002-155128

(51) Int. Cl.[7] ............................................. G06F 17/50
(52) U.S. Cl. ................................ 716/1; 716/4; 324/719
(58) Field of Search .......................... 716/1, 4; 324/719

(56) References Cited

U.S. PATENT DOCUMENTS

| | | | | |
|---|---|---|---|---|
| 5,581,475 A | * | 12/1996 | Majors | 716/10 |
| 5,963,729 A | * | 10/1999 | Aji et al. | 716/5 |
| 6,010,962 A | * | 1/2000 | Liu et al. | 438/687 |
| 6,532,570 B1 | * | 3/2003 | Mau | 716/2 |
| 6,578,178 B2 | * | 6/2003 | Mau | 716/2 |
| 6,603,321 B2 | * | 8/2003 | Filippi et al. | 324/719 |
| 6,634,013 B2 | * | 10/2003 | Shinzawa | 716/5 |
| 2003/0080761 A1 | * | 5/2003 | Filippi et al. | 324/719 |

FOREIGN PATENT DOCUMENTS

| | | |
|---|---|---|
| JP | 4-340739 | 5/1999 |
| JP | 2000-3947 | 1/2000 |
| JP | 2000-058544 | 2/2000 |

OTHER PUBLICATIONS

Gan, C.L., et al., "Contrasting failure characteristics of different levels of dual–damascene metallization", IEEE. 7/02. pp. 124–128.*

* cited by examiner

Primary Examiner—Stacy A. Whitmore
(74) Attorney, Agent, or Firm—Dickstein, Shapiro, Morin & Oshinsky, LLP.

(57) ABSTRACT

An interconnect of a semiconductor device having a multi-layer interconnect structure is designed by predicting the life of the interconnect governed by an electromigration with different predicting models that are classified according to a void incubation period and a void growth period of a void that occurs in the vicinity of a junction between the interconnect and a via which connects upper and lower interconnect, and designing the interconnect based on the predicted life. The different predicting models are classified according to whether the interconnect with the void is positioned above or below the via.

15 Claims, 8 Drawing Sheets

METHOD OF DESIGNING INTERCONNECTS

BACKGROUND OF THE INVENTION

1. Field of the Invention

The present invention relates to a method of designing interconnects, and more particularly to a method of designing interconnect for semiconductor devices having a multilayer interconnect structure that employs copper (Cu) as an interconnect material.

2. Description of the Related Art

There has heretofore been known a method of forming metal interconnect in semiconductor devices such as LSI (Large Scale Integrated) circuits.

While aluminum (Al) has been used as a major interconnect material, Cu has recently found a growing use as another interconnect material in order to decrease interconnect resistivity and increase migration resistance for higher device performance.

For forming Cu interconnect, the damascene technology is widely used because it would be difficult to etch thin films of Cu that have been formed. The damascene process is a process of forming Cu interconnects by embedding Cu in grooves according to a film growing process such as plating or the like and thereafter using the chemical mechanical polishing to remove excessive Cu therefrom. The damascene process is divided into a single damascene process and a dual damascene process. According to the single damascene process, metals for making up vias is embedded before interconnects are formed.

For producing interconnect according to the damascene technology, it is necessary to provide a barrier metal for preventing embedded Cu from being diffused into interlayer dielectrics. Since the barrier metal is present in an interconnect region that is held in contact with a via, a material continuity is lost in the interconnect region that contacts the via.

When current flows through a metal interconnect in an LSI circuit, an electromigration in which metal atoms move interconnect stresses in the direction of the electron flow occurs there. A large number of holes that are accumulated upstream in the electron flow become physical holes that can optically be observed, i.e., a void. The metal atoms existing at any position move interconnect stresses in the direction of the electron flow. Since the barrier metal is present in an interconnect region that is joined to a via and metal atoms cannot penetrate the barrier metal, the metal atoms only move in the interconnect region joined to the via, and no fresh metal atoms are supplied to the interconnect region joined to the via. Therefore, holes from which the metal atoms have moved, i.e., a void, are liable to be formed in the interconnect region joined to the via.

Interconnects where a void produced by the movement of metal atoms has grown to a certain size is rendered electrically nonconductive or has its resistance increased, presenting signal transmission difficulties. Therefore, it has been customary at the time of designing an LSI circuit to produce an interconnect life predicting formula for allowing interconnect to transmit signals without being adversely affected by voids within a desired period of actual use. An LSI interconnect life that is predicted based on the interconnect life predicting formula has posed a limitation on the designing of LSI circuits. The interconnect life predicting formula for interconnect has been produced uniformly based on the characteristics of an interconnect structure whose life is shortest. Consequently, an interconnect structure that is less liable to generate voids and hence is expected to have a longer life is given an excessive limitation on an allowable current value therefore. Stated otherwise, an interconnect life cannot accurately be recognized because no consideration has been given to the fact that an interconnect life is varied depending on whether voids are easily generated or not. Certain interconnect structures are thus subject to unnecessary allowable current limitations, which prevent semiconductor devices from being designed for higher-speed operation.

SUMMARY OF THE INVENTION

It is therefore an object of the present invention to provide a method of designing interconnects without posing unnecessary allowable current limitations thereon by accurately recognizing an interconnect life in view of the fact that an interconnect life is varied depending on whether voids are easily generated or not.

To accomplish the above object, there is provided a method of designing an interconnect of a semiconductor device having a multilayer interconnect structure, comprising the steps of predicting the life of the interconnect governed by an electromigration with different predicting models that are classified according to a void incubation period and a void growth period of a void that occurs in the vicinity of a junction between the interconnect and a via which connects upper and lower interconnect, and designing the interconnect based on the predicted life.

According to the above method, the life of an interconnect governed by an electromigration is predicted with different predicting models that are classified according to a void incubation period and a void growth period of a void that occurs in the vicinity of a junction between the interconnect and a via which connects upper and lower interconnect, and the interconnect of a semiconductor device having a multilayer interconnect structure is designed based on the predicted life. Therefore, the life of the interconnect can accurately be recognized in view of different interconnect lives depending on whether a void can easily be formed or not, and the interconnect can be designed without unduly limiting an allowable current therefore.

Furthermore, there is also provided in accordance with the present invention a method of checking an interconnect when the interconnect is designed by the above method of designing the interconnect.

The above and other objects, features, and advantages of the present invention will become apparent from the following description with reference to the accompanying drawings which illustrate an example of the present invention.

DETAILED DESCRIPTION OF THE PREFERRED EMBODIMENT

Figure 1A:
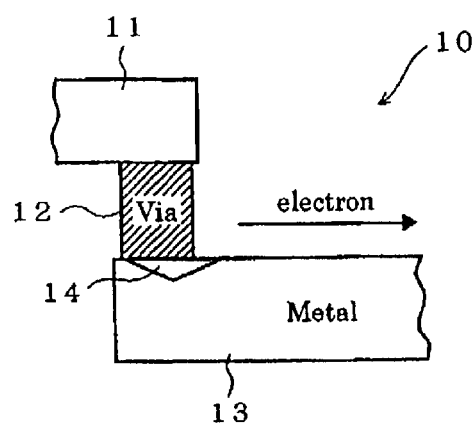
FIGS. 1a and 1b are fragmentary cross-sectional views showing how voids are produced, the views being illustrative of a method of designing an interconnect according to an embodiment of the present invention.
Figure 1B:
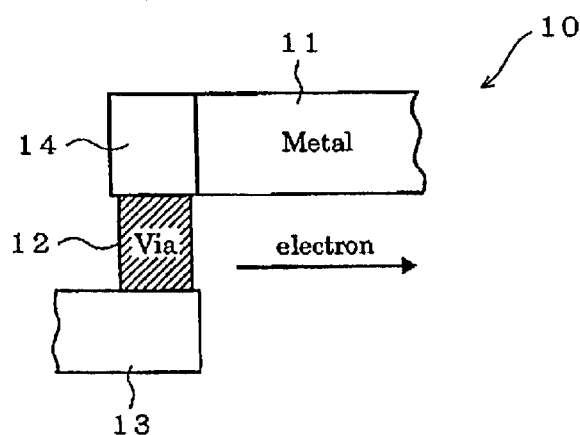

FIGS. 1a and 1b show in fragmentary cross section how voids are produced, the views being illustrative of a method of designing an interconnect according to an embodiment of the present invention. As shown in FIGS. 1a and 1b, different voids 14 are produced in lower-layer interconnect 13 and an upper-layer interconnect 14 depending on how electrons flow in Cu interconnect structures 10 which have been formed according to the damascene technology.

As shown in FIG. 1(a), when electrons flow from upper-layer interconnect 11 through joint via 12 to lower-layer interconnect 13, void 14 is produced in lower-layer interconnect 13. As shown in FIG. 1(b), when electrons flow from lower-layer interconnect 13 through joint via 12 to upper-layer interconnect 11, void 14 is produced in upper-layer interconnect 11. Void 14 causes an increase in the interconnect resistance. The volume of the void that is required to cause such an increase in the interconnect resistance differs between void 14 that is produced in lower-layer interconnect 13 and void 14 that is produced in upper-layer interconnect 11.

When a current flows in an LSI metal interconnect, an electromigration that is a phenomenon in which metal atoms move interconnect stresses in the direction of the electron flow due to an exchange of momentum which happens when the flowing electrons and the metal atoms impinge upon each other occurs there. A large number of holes that are accumulated upstream in the electron flow due to the motion of the metal atoms produce a void, i.e., physical holes that can optically be observed. The void occurs mainly in a region where the holes can easily be accumulated.

Because the propulsion for moving the metal atoms is produced by the exchange of momentum between the flowing electrons and the metal atoms and also because the probability that the metal atoms exceed the potential at the time they move across lattice points is greater as the temperature is higher, factors that accelerate the electromigration are a current density and an atmospheric temperature.

An interconnect where a void has grown to a certain size is rendered electrically nonconductive or has its resistance increased, presenting signal transmission difficulties. Therefore, when an LSI circuit is designed, it is necessary to limit an atmospheric temperature and a drive current in order that resistance trouble caused by an electromigration will be in a negligible range within a desired period of actual use. Generally, an interconnect life predicting formula is produced as a result of an acceleration test based on a plurality of high atmospheric temperatures and a plurality of high current densities, and a limited current is calculated from the desired period for which the LSI circuit will actually be used and the temperature at which the LSI circuit will be used based on the produced interconnect life predicting formula. The calculated limited current poses a limitation on the designing of the LSI circuit.

Interconnect of Al or Al alloy (generally AlCu) which have heretofore been used are formed by depositing a thin film on the interconnect surface of a wafer according to physical vapor deposition (PVD) and then patterning the deposited thin film into an interconnect. It is the general practice to deposit a metal having a high melting point, e.g., Ti or TiN, which is referred to as a barrier metal, above and below the main interconnect metal, i.e., Al or Al alloy. The barrier metal thus deposited serves the purpose of preventing reflections for keeping redundancy and exposure accuracy at the time a void occurs due to a stress migration.

Therefore, the patterned interconnect is accompanied by the barrier metal layers above and below the Al or Al alloy. The barrier metal is less subject to an electromigration as its diffusion coefficient is smaller than the main interconnect metal, i.e., Al or Al alloy. Consequently, when a void occurs in the Al or Al alloy due to an electromigration, the barrier metal layers remain unchanged in shape and contribute to electrical conduction, preventing the interconnect from being completely broken.

In a via which interconnect upper and lower interconnect layers, the gradient of an atomic flow is maximized by the barrier metal and the via. Stated otherwise, since the atomic flow is blocked in the via, holes are concentrated in the via, tending to produce a void in the via. However, since a barrier metal layer is present together with the Al or Al alloy as the main interconnect metal positioned above and below the barrier metal layer, the via is not fully disconnected irrespectively of the positional relationship between the interconnect and the via. When the void grows to a certain size to increase the interconnect resistance, the interconnect are judged as suffering a failure.

Cu interconnect are produced by a process different from the process of forming Al interconnect because it is difficult to pattern thin films of Cu by etching. At present, the damascene technology is generally used to form Cu interconnect.

According to the damascene technology, a groove is etched in a pre-deposited interconnect film, and a barrier metal for preventing Cu from being diffused and a Cu seed layer are deposited on the interconnect film by physical vapor deposition or the like. Thereafter, the groove is filled up with Cu by plating or the like, and then the surface formed so far is ground to remove any excessive Cu layers other than the interconnect layer in the groove by CMP (Chemical Mechanical Polishing), thereby completing the interconnect.

Generally, an insulating film of SiN or the like which is not largely diffused with Cu is deposited on the CMP surface by chemical vapor deposition (CVD) or the like, so that the CMP surface is covered with the insulating film, i.e., a cap insulating film. Therefore, any barrier metal layer which is made of a metal having a high melting point is not present on the upper surface of the damascene interconnect which is made of Cu or a Cu alloy containing Cu as a main conductive material.

The high-speed diffusion path of an electromigration in damascene Cu interconnect is an interconnect between the upper surface of the Cu layer produced by the CMP and the cap insulating film. The interconnect between the barrier metal in the side walls and bottom of the groove and the Cu is a relatively slow diffusion path of the electromigration. The grain boundary (GB) is not a dominant diffusion path because the proportion of twins serving as a coherent grain boundary is large. Therefore, a series of phenomena, i.e., movement of atoms, concentration of holes, and generation of avoid, start to occur from the interconnect between the Cu and the cap insulating film.

On account of the above nature of the damascene Cu interconnect, the volume of the void which is required to cause such an increase in the interconnect resistance differs between void 14 that is produced in lower-layer interconnect 13 when electrons flow from upper-layer interconnect 11 through joint via 12 (see FIG. 1a) and void 14 that is produced in upper-layer interconnect 11 when electrons flow from lower-layer interconnect 13 through joint via 12 (see FIG. 1b).

Specifically, in the region where lower-layer interconnect 13 and joint via 12 are held in contact with each other, the interconnect between the bottom of joint via 12 (e.g., a tungsten-embedded via or a Cu-embedded via produced by the damascene process) and the Cu of lower-layer interconnect 13 is a region where the atomic flow gradient is maximum and serves as a high-speed diffusion path, void 14 occurs in the interconnect. Since no barrier metal is present in the interconnect, an abrupt resistance increase which is nearly equivalent to a complete disconnection occurs due to void 14.

In the region where joint via 12 and upper-layer interconnect 11 are connected to each other, though the atomic flow gradient is maximum, since the high-speed diffusion path is the interconnect between upper-layer interconnect 11 of Cu and cap insulating film, void 14 is generated from the upper surface of upper-layer interconnect 11 of Cu.

Therefore, void 14 which is produced in the upper surface of upper-layer interconnect 11 of Cu does not have any effect whatsoever on the electric conduction, and does not affect a resistance change until void 14 grows into a region over joint via 12.

When electrons flow from upper-layer interconnect 11 through joint via 12 (see FIG. 1a), since the volume of void 14 which is required to increase the resistance may be small, the interconnect have a shorter life. When electrons flow from lower-layer interconnect 13 through joint via 12 (see FIG. 1b), since the void 14 which is required to increase the resistance needs to be grown largely along the depth and length of the interconnect until void 14 grows into the region over joint via 12, the interconnect have a relatively long life. If the interconnect life governed by an electromigration is observed separately in terms of a void incubation period and a void growth period, then the void incubation period and the interconnect life when electrons flow from upper-layer interconnect 11 through joint via 12 (see FIG. 1a) are the same as each other. The interconnect life when electrons flow from lower-layer interconnect 13 through joint via 12 (see FIG. 1b) is equal to the sum of the void incubation period and the void growth period until void 14 is grown to the length which causes a resistance increase.

Inasmuch as the void incubation period is inversely proportional to the square of the current density, the interconnect life governed by void 14 when electrons flow from upper-layer interconnect 11 through joint via 12 (see FIG. 1a) is inversely proportional to the square of the current density. The activating energy for the interconnect life is in agreement with the activating energy for the void incubation period.

The void incubation period is inversely proportional to the square of the current density when electrons flow from lower-layer interconnect 13 through joint via 12 (see FIG. 1b). The subsequent void growth period is inversely proportional to the current density itself. Therefore, the interconnect life when electrons flow from lower-layer interconnect 13 through joint via 12 (see FIG. 1b) is longer than the interconnect life when electrons flow from upper-layer interconnect 11 through joint via 12 (see FIG. 1a).

Consequently, the interconnect that is of the structure in which electrons flow from lower-layer interconnect 13 through joint via 12 (see FIG. 1b) may be given a larger allowable current than the interconnect that is of the structure in which electrons flow from upper-layer interconnect 11 through joint via 12 (see FIG. 1a). A current outlet of a clock interconnect which has a high current density may have increased reliability by employing the structure in which electrons flow from lower-layer interconnect 13 through joint via 12 (see FIG. 1b).

Figure 2:
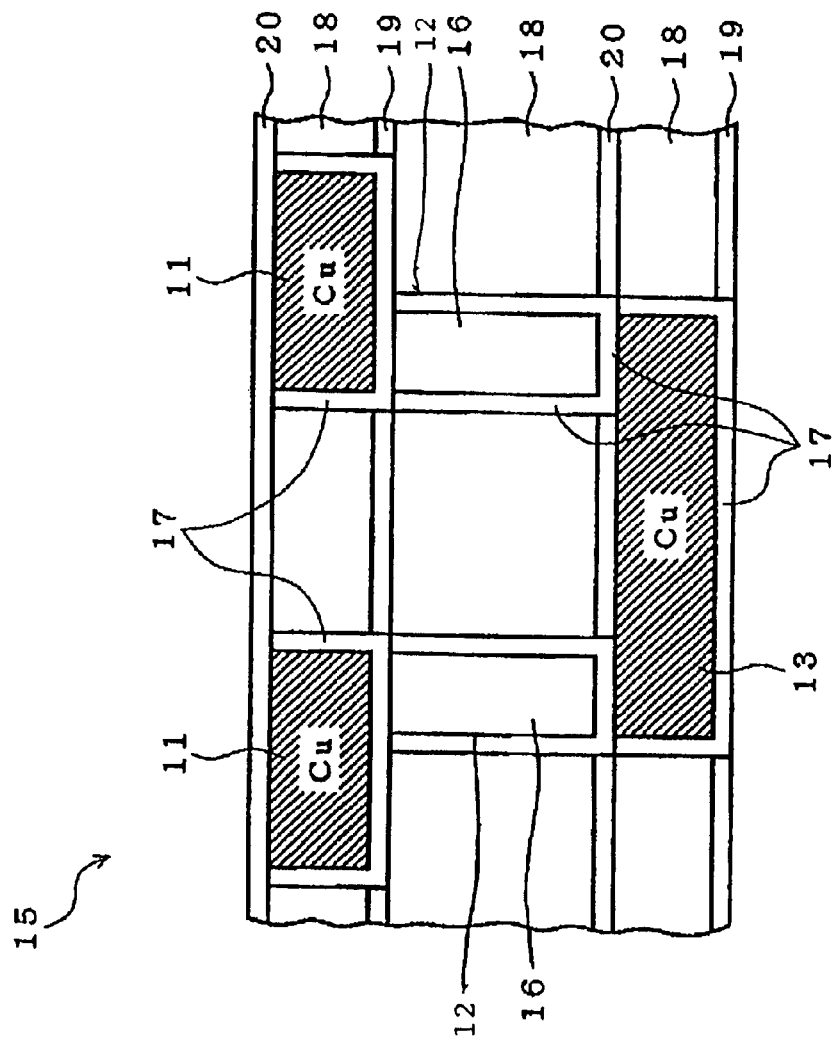
FIG. 2 is a fragmentary cross-sectional view of a semiconductor device having a Cu interconnect structure as an experimental sample.
Figure 3A:
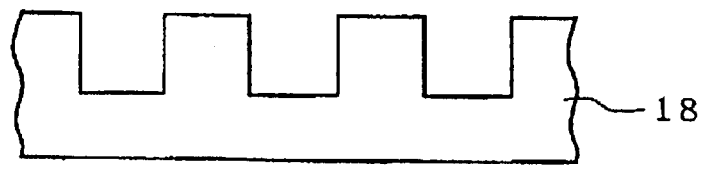
FIGS. 3a through 3d are fragmentary cross-sectional views showing a process of manufacturing the Cu interconnect structure shown in FIG. 2.
Figure 3B:
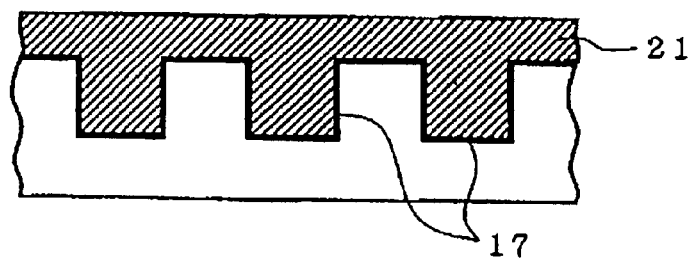
Figure 3C:
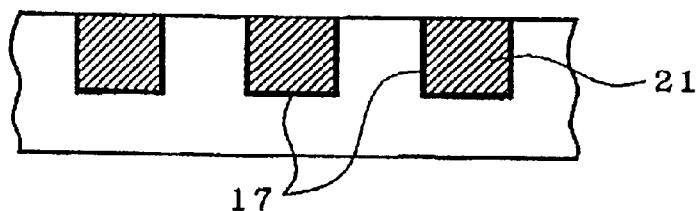
Figure 3D:
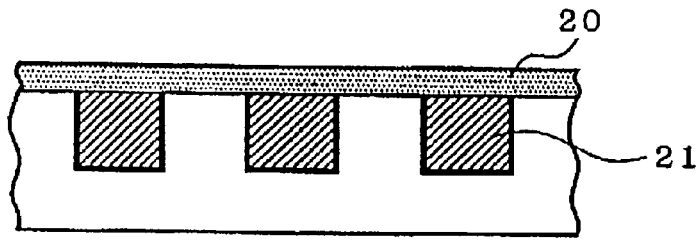

The evaluation of a void incubation period, a drift velocity, and a threshold condition in an electromigration of single-damascene Cu interconnect will be described below. Using a test structure for evaluating a void growth, an electromigration behavior of fine damascene Cu interconnect has been inspected for stress dependency in an incubation time until a void occurs and a void growth period, and a diffusion mechanism has been studied. FIG. 2 shows in fragmentary cross section a semiconductor device having a Cu interconnect structure as an experimental sample. As shown in FIG. 2, semiconductor device 15 having a Cu interconnect structure includes upper-layer interconnect 11 and lower-layer interconnect 13, which are made of Cu or a Cu alloy containing Cu as a main conductive material (e.g., CuSn, CuTi, CuSi, CuZr, Ag, etc.), electrically connected to each other by joint vias 12.

Interconnect 11, 13 and plugs 16 embedded in respective vias 12 are covered with a barrier metal layer 17 made of TiN, Ta, TaN, or the like, except for their upper surfaces. The upper surfaces of interconnect 11, 13 and plugs 16 are covered with a nitride film (not shown) for preventing diffusion except for joints between of interconnect 11, 13 and plugs 16.

Lower-layer interconnect 13 is formed in a layer comprising lower-layer interconnect 13, interconnect insulating film 18, lower barrier metal layer 17, and etching stopper film 19. Plugs 16 are formed in a layer comprising Plugs 16, interconnect insulating film 18, barrier metal layers 17 and cap insulating film 20. Upper-layer interconnect 11 are formed in a layer comprising upper-layer interconnect 11, interconnect insulating film 18, barrier metal layer 17, etching stopper film 19, and upper cap insulating film 20.

FIGS. 3a through 3d show a fragmentary cross section depicting a process of manufacturing the Cu interconnect structure shown in FIG. 2. As shown in FIGS. 3a through 3d, for forming Cu interconnect 11, 13 according to the single damascene process, grooves for embedding Cu therein are formed in interconnect insulating film 18 (see FIG. 3a). Then, barrier metal layer 17 and Cu seed layer are deposited in the grooves by PVD, and thereafter Cu (Cu) 21 is embedded in the grooves by plating (see FIG. 3b). Then, the surface formed so far is ground by CMP to remove excessive Cu 21, so that the surface including interconnect regions is planarized (see FIG. 3c). Thereafter, cap insulating film 20 is formed to cover the ground surface (see FIG. 3d). The interconnect of Cu or Cu alloy which have been produced by the damascene process have no barrier metal of high melting point on their upper surfaces.

Figure 4:
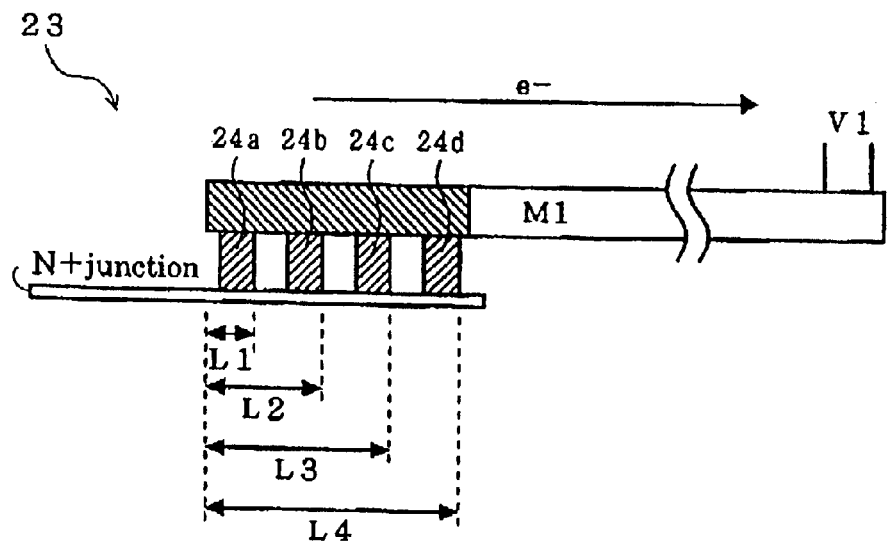
FIG. 4 is a cross-sectional view showing a conceptual representation of a test structure for evaluating a void growth in the experimental sample shown in FIG. 2.

FIG. 4 shows in a cross sectional view a conceptual representation of a test -structure for evaluating a void growth in the experimental sample shown in FIG. 2. As shown in FIG. 4, test structure 23 comprises two layers of damascene interconnect (not shown) and an N+ diffused layer (N+ junction). A piece interconnect test is a Cu interconnect (Metal 1: M1) produced by the single damascene process.

Cu interconnect M1 is connected to the N+ diffused layer by four contacts 24a through 24d. Interconnect M1 has an anode end connected to a via (V1) and a Cu interconnect (Metal 2: M2 (not shown)) which are produced by a dual damascene process. The Cu interconnect M2 is positioned above interconnect M1.

The Cu interconnect M2 has a sufficient width and a reservoir for preventing a void from being produced by an electromigration. An FSG (Fluorine Doped Silicon Glass) film is disposed between the interconnect layers, and a SiN film is used as a cap insulating film. Cu interconnect M1 was tested in a temperature range from 255 to 350 at a current density ranging from 1.9 to 7.7 MA/cm2 (Cu interconnect M1) with electrons flowing from the left to the right in FIG. 4.

In the test, void 14 was grown from a cathode end. When void 14 reached length L1 (first contact position) from the cathode end, the resistance changed stepwise. Each time void 14 subsequently reached length L2 (second contact position) from the cathode end, length L3 (third contact position) from the cathode end, and length L4 (fourth contact position) from the cathode end, step-like resistance change was observed. The times at which the step-like resistance changes occurred can be obtained from a resistance change monitor.

Figure 5:
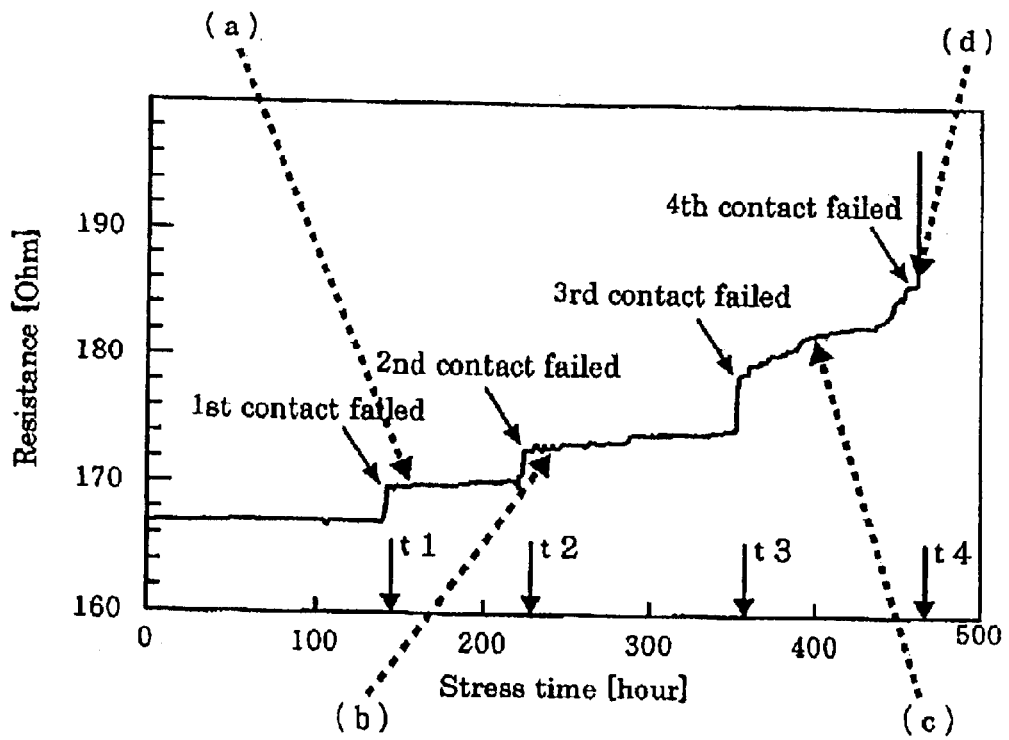
FIG. 5 is a graph showing step-like resistance changes that occurred successively with time in the test structure shown in FIG. 4.
Figure 6A:
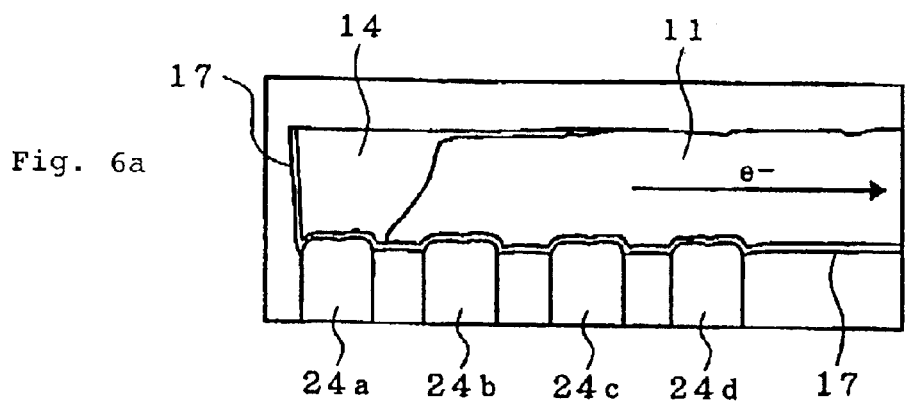
FIGS. 6a through 6d are views showing how voids grew with the step-like resistance changes shown in FIG. 5.
Figure 6B:
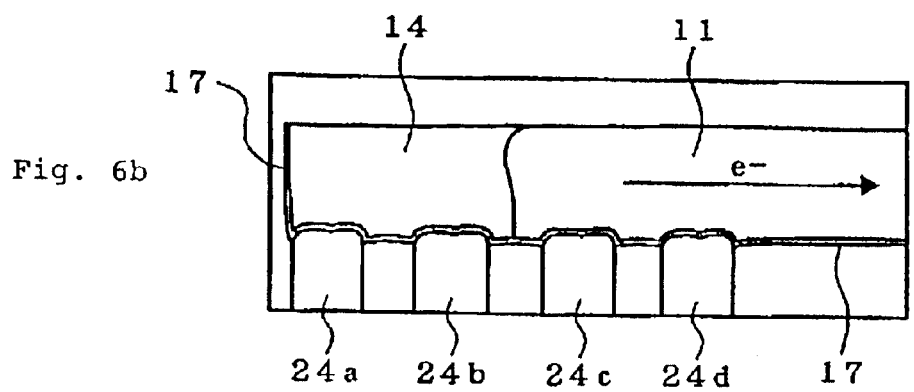
Figure 6C:
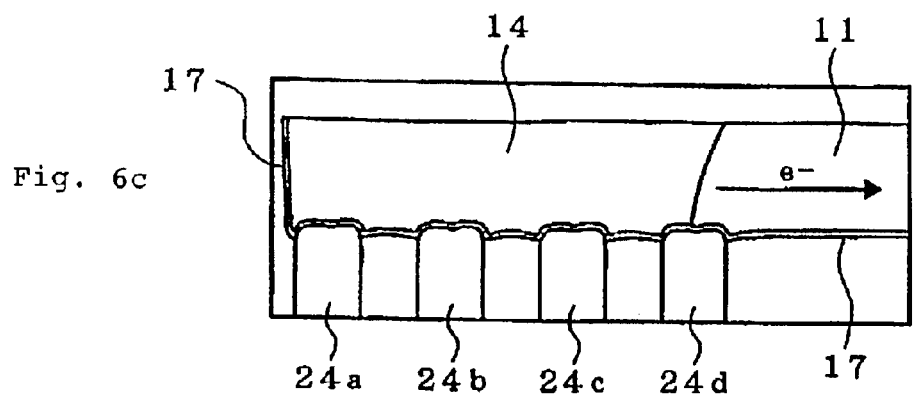
Figure 6D:
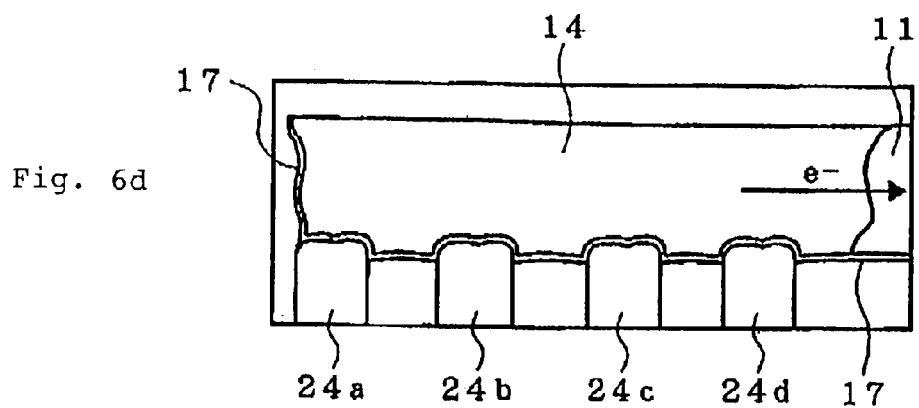

FIG. 5 shows step-like resistance changes that occurred successively with time in the test structure shown in FIG. 4, and FIGS. 6a through 6d show how the void grew with the step-like resistance changes shown in FIG. 5. As shown in FIGS. 5 and 6a through 6d, the resistance [ ] changed stepwise as stress time [h] elapses.

At time t1 from the start of the test, the resistance increased from about 167 [ ] to about 170 [ ] (see FIG. 5). At this time, the growth of void 14 reached first contact 24a, and atoms of the main interconnect metal moved to a position between first contact 24a and second contact 24b (see FIG. 6a). Specifically, after elapse of time t1, the void length become length L1 from the cathode end due to the growth of void 14, indicating that first contact 24a of all four contacts 24a through 24d (see FIG. 4) failed. At time t2 from the start of the test, the resistance increased from about 170 [ ] to about 173 [ ] (see FIG. 5). At this time, the growth of void 14 reached second contact 24b, and atoms of the main interconnect metal moved to a position between second contact 24b and third contact 24c (see FIG. 6b). Specifically, after elapse of time t2, the void length become length L2 from the cathode end due to the growth of void 14, indicating that second contact 24b, in addition to first contact 24a, of all four contacts 24 a through 24d (see FIG. 4) failed.

At time t3 from the start of the test, the resistance increased from about 174 [ ] to about 178 [ ] (see FIG. 5). At this time, the growth of void 14 reached third contact 24c. Thereafter, when the resistance further increased to about 182 [ ], the growth of void 14 reached fourth contact 24d, and atoms of the main interconnect metal moved to a position above the fourth contact 24d (see FIG. 6c). Specifically, after elapse of time t3, the void length become length L3 from the cathode end due to the growth of void 14, indicating that third contact 24c, in addition to first and second contacts 24a, 24b, of all four contacts 24a through 24d (see FIG. 4) failed. At time t4 from the start of the test, the resistance increased to about 185 [ ] (see FIG. 5). At this time, the growth of void 14 reached a position beyond fourth contact 24d, and atoms of the main interconnect metal moved to a position that is completely spaced from fourth contact 24d (see FIG. 6d). Specifically, after elapse of time t4, the void length exceeded length L4 from the cathode end due to the growth of void 14, indicating that fourth contact 24d, in addition to first, second, and third contacts 24a, 24b, 24c, of all four contacts 24a through 24d (see FIG. 4) failed.

With test structure 23, metal atoms start moving interconnect stresses in the direction of the electron flow due to an electromigration. As a result, holes are concentrated in a region opposite to the direction of movement of the metal atoms, and grown into physical holes (void 14). Since the holes are progressively accumulated, void 14 appears to be growing.

At the time when void 14 grows to a position beyond first contact 24a, first contact 24a is isolated, increasing the resistance by a value corresponding to one contact. The observation of the resistance indicates that each time void 14 grows beyond one contact 24, the resistance increases one step, and when void 14 grows beyond final contact 24d, only the upper surface of contact 24d and barrier metal layer 17 on the sides of Cu interconnect M1 are connected to each other, resulting in a very high resistance value.

If the same current flows through Cu interconnect M1 at all times, then the metal atoms move at a constant speed. Therefore, if the times at which the step-like resistance changes occurred are represented by a horizontal axis and the lengths (L1 through L4) from the cathode end are represented by a vertical axis, then a linear curve can be plotted as representing the relationship between the times on the horizontal axis and the lengths on the vertical axis. The linear curve has a gradient indicative of a drift velocity.

Figure 7:
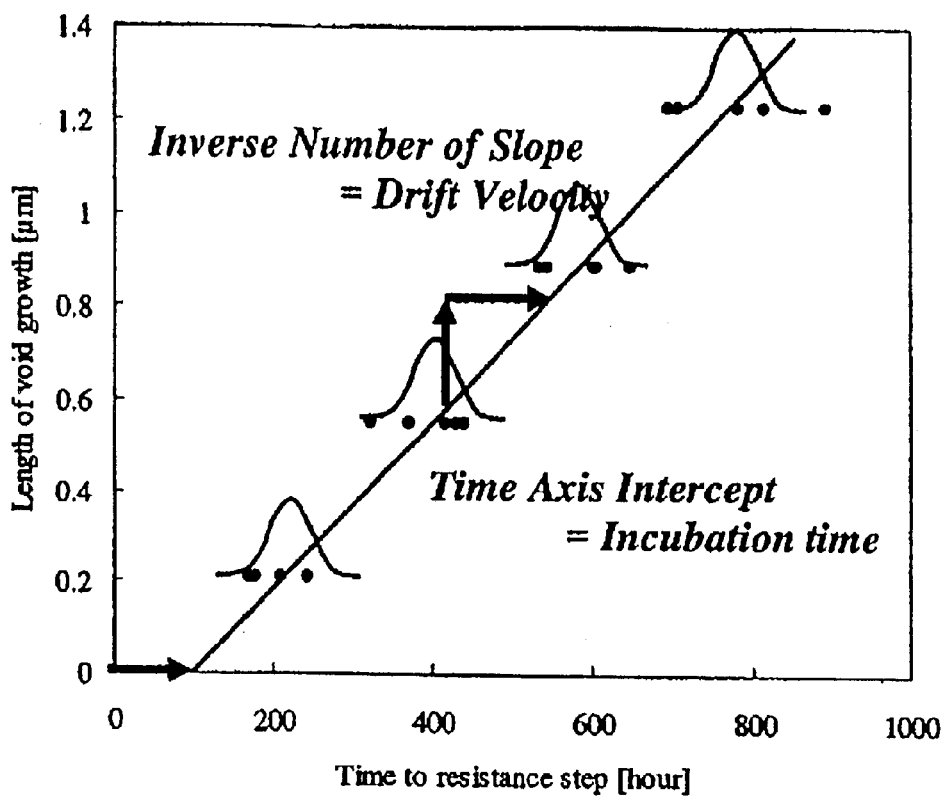
FIG. 7 is a graph showing the relationship between the times of the step-like resistance changes shown in FIGS. 6a through 6d and the length from a cathode end.

FIG. 7 shows the relationship between the times at which the step-like resistance changes occurred, as represented by an x-axis, and the lengths from the cathode end, as represented by a y-axis. As shown in FIG. 7, the gradient of the illustrated linear curve indicates a drift velocity, with an x-interconnect representing a void incubation period until metal atoms start moving after a current has been supplied. In order to obtain an accurate drift velocity, in view of unevenness of the times, an inverse number of the gradient or slope of the linear curve is used as a drift velocity.

It can be seen from the above experiment that when a damascene Cu interconnect suffers an electromigration, the interconnect surface provides a very quick diffusion path, producing void 14 initially on the interconnect surface. Therefore, the interconnect structure shown in FIG. 1 acauses an abrupt resistance increase, and ceases to operate as a circuit.

Void 14 is generated from the interconnect surface because the mechanical polishing of the interconnect surface has produced many metal atom defects and many holes, making the mobility of metal atoms higher in the interconnect surface. As a consequence, an interconnect failure occurs when void 14 occurring in the interconnect surface is progressively spread, and the resistance increases after all Cu atoms in the volume of spreading void 14 are eliminated. If even a small number of Cu atoms remain in the interconnect, they keep the interconnect electrically conductive, causing no resistance increase.

Figure 8A:
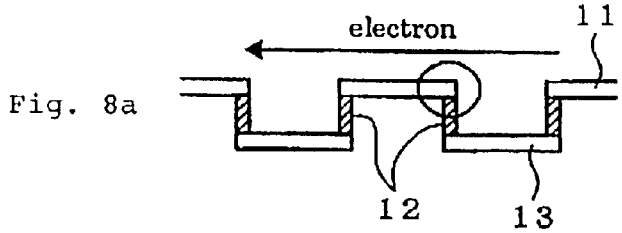
FIG. 8a is a view showing a first analytical result of void growth that is produced by a transmission electron microscope.
Figure 8B:
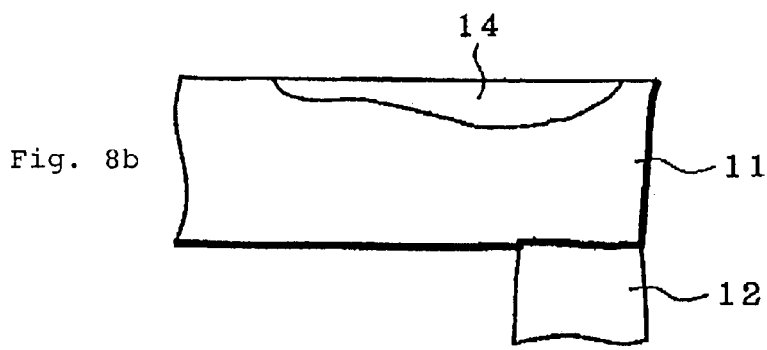
FIG. 8b is an enlarged fragmentary view showing the first analytical result in detail.
Figure 9A:
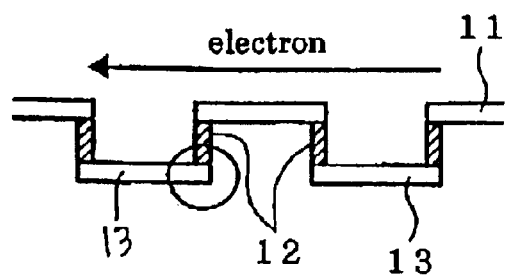
FIG. 9a is a view showing a second analytical result of void growth that is produced by a transmission electron microscope.
Figure 9B:
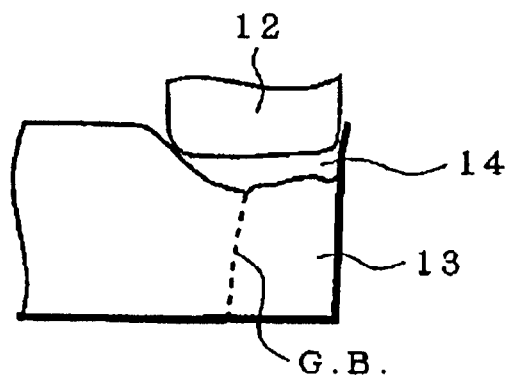
FIG. 9b is an enlarged fragmentary view showing the second analytical result in detail.

FIGS. 8a and 8b show a first analytical result of void growth which is produced by a transmission electron microscope, and FIGS. 9a and 9b show a second analytical result of void growth which is produced by a transmission electron microscope. As shown in FIGS. 8a and 8b, 9a and 9b, an observation of voids 14 produced above and below vias 12 with a transmission electron microscope (TEM) has confirmed that interconnect different void growth patterns are brought about depending on the layout of Cu interconnect.

When electrons flow from lower-layer interconnect 13 through via 12 to upper-layer interconnect 11 (see FIG. 8a), void 14 occurs in a Cu/SiN interconnect of upper-layer interconnect 11, and grows from the position of via 12 along the electron as if void 14 flowed into upper-layer interconnect 11. No void 14 occurs in a barrier metal/Cu interconnect in barrier metal layer 17 (see FIG. 2) between upper-layer interconnect 11 and via 12. Cu atoms in a volume corresponding to upper-layer interconnect 11 need drifted out (see FIG. 8b). When electrons flow from upper-layer interconnect 11 through via 12 to lower-layer interconnect 13 (see FIG. 9a), void 14 occurs in lower-layer interconnect 13 beneath via 12. The number of Cu atoms drifted out is small (see FIG. 9b). In FIG. 9b, a constriction is seen in the grain boundary (G.B.).

There is a time until void 14 is initially formed, i.e., an incubation time, because void 14 is negligibly small in that time, or a certain time is required until holes are concentrated and grown into physical holes. This time and the life of the interconnect shown in FIG. 9b are substantially in conformity with each other.

The incubation time is obtained by measuring the speed at which Cu atoms have moved along the length of the interconnect after void 14 was actually formed. Thus, the incubation time is finished when a region where Cu atoms are completely eliminated along the depth of the groove is produced in the interconnect. Stated otherwise, the incubation time is finished when the length of the interconnect becomes shorter even slightly than before. Since void 14 produced in the interconnect surface needs to grow along the depth of the groove, the actual interconnect life is slightly shorter than the incubation time.

It is interconnect from the experimental results that the interconnect life can be defined by the incubation time if void 14 occurs beneath via 12, and can be defined by a distribution of Cu atoms as they are drifted out until via 12 if void 14 occurs above via 12. The stress dependency of the current in the incubation time is inversely proportional to the square of the current, and the movement of Cu atoms as they are drifted out is inversely proportional to the current itself. The experimental results show that these different dependencies on the current should be considered separately.

For actually designing a device having the above interconnect structure, a target life for the product (interconnect) is determined, and an environmental temperature is used as a device guarantee temperature. Given predetermined constants, a current density J can be calculated from an experimentally determined value of active energy and a coefficient of current dependency. From an equation representing an interconnect life (Time to Failure: Ttf):

$$Ttf = A/Jn \cdot \exp(/kT),$$

the current density J is determined as follows:

$$J = \{A/Ttf \cdot \exp(/kT)\} 1/n$$

where A represents a constant, represents activating energy for diffusion, k represents the Boltzmann's constant, and T represents the absolute temperature.

By designing the device to a current setting lower than the calculated current, it is possible to achieve the target life. When electrons flow from upper-layer interconnect 11 to lower-layer interconnect 13 (see FIGS. 9a and 9b), since the interconnect life is substantially equal to the incubation time, the interconnect life is inversely proportional to the square of the current. When electrons flow from lower-layer interconnect 13 to upper-layer interconnect 11 (see FIGS. 8a and 8b), since the interconnect life is equal to the sum of the incubation time and the drift tim e inversely proportional to the current itself, the interconnect life is actually calculated by a quadratic equation.

According to the present invention, as described above, the life of an interconnect comprising a layer of Cu or a Cu alloy containing Cu as a main conductive material, in a single damascene via, is handled independently as a void incubation period and a void growth period (drift period) of a void that occurs in the vicinity of a junction with the via, and life predicting models which differ depending on the structure and positional relationship between the interconnect and the via are applied to predict the life of the interconnect, i.e., the reliability of the interconnect.

Therefore, an interconnect structure and a device product can be designed based on the predicted interconnect life, and a limited current for the interconnect can be changed depending on the positional relationship between the interconnect and the via, i.e., depending on whether the interconnect is positioned above or below the via. If the interconnect is positioned below the via, the interconnect structure is designed according to a limited current based on the void incubation period, and if the interconnect is positioned above the via, the interconnect structure is designed according to a limited current based-on the sum of the void incubation period and the void growth period. As a result, it is possible to give a larger allowable current to via 12 that is connected to upper-layer interconnect 11, for higher-speed device configurations. For via 12 that is connected to lower-layer interconnect 13, an allowable current is relatively small, but as the interconnect life is in agreement with the void incubation period, the interconnect life is determined so as to be inversely proportional to the square of the current density.

Since a limited current for an interconnect can be changed depending on the positional relationship between the interconnect and via 12, when an electromigration is checked by using a design reliability verification CAD (Computer-Aided Design), a checking process can be changed depending on the positional relationship between the interconnect and via 12.

Figure 10:
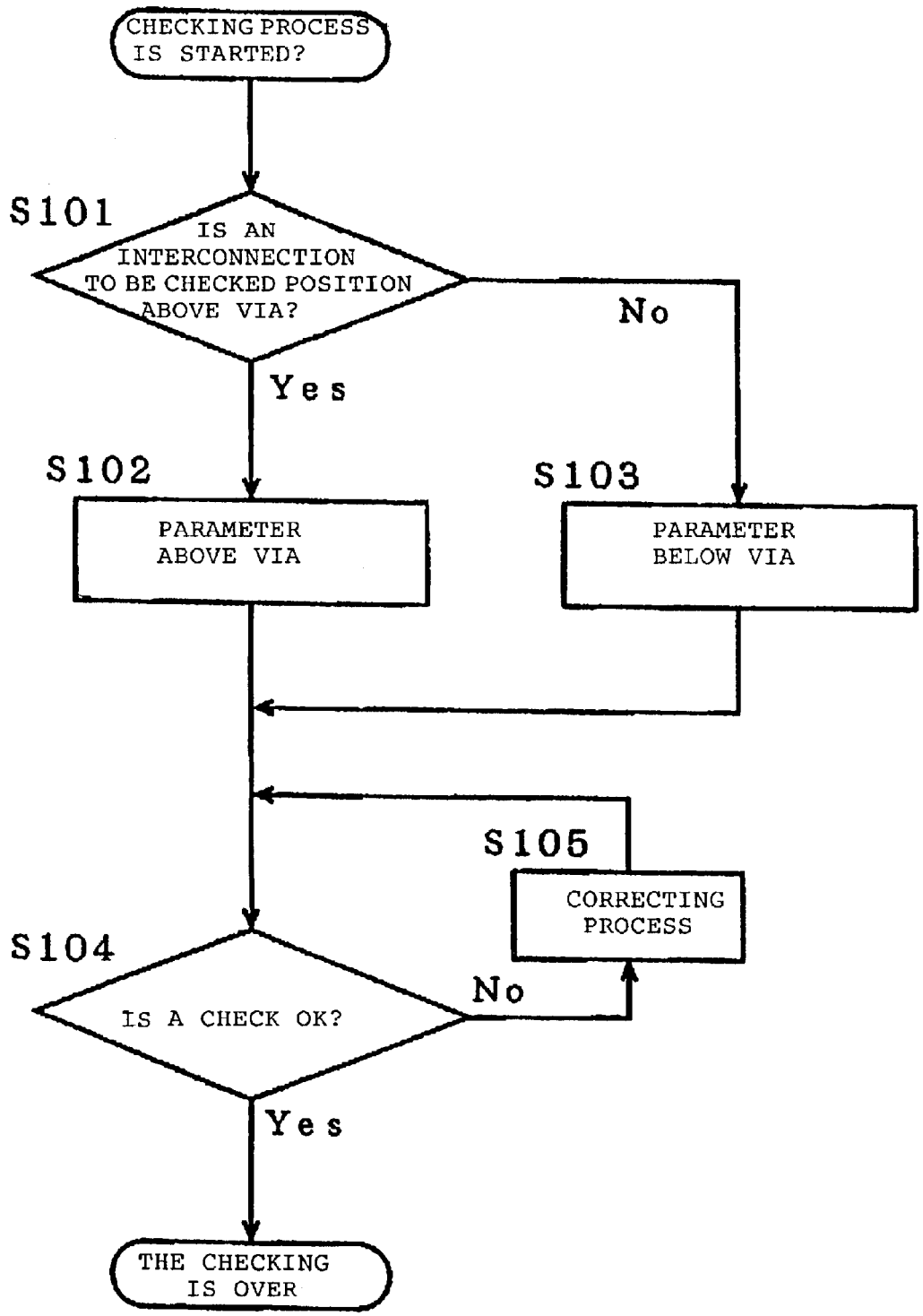
FIG. 10 is a flowchart of a checking process carried out by a CAD tool for verifying the design reliability of an interconnect designing process.

FIG. 10 shows a checking process carried out by a CAD tool for verifying the design reliability of an interconnect designing process. When an interconnect is designed by using a design reliability verification CAD, an electromigration is checked according to the checking process shown in FIG. 10, as described below. When the checking process is started, it is determined whether an interconnect to be checked is positioned above via 12 or not in step S101. If the interconnect is positioned above via 12 (Yes), then a parameter above via 12 based on an allowable current is used in step S102. If the interconnect is positioned below via 12 (No), then a parameter below via 12 based on an allowable current is used in step S103.

After the interconnect is checked by using the parameters, it is determined whether the checked interconnect is OK or not in step S104. If the checked interconnect is OK (Yes), then the checking process is ended. If the checked interconnect is not OK (No), then a correcting process is carried out in step S105, and thereafter it is determined whether the check is OK or not in step S104.

Heretofore, the interconnect is checked by using one parameter regardless of whether the interconnect to be checked is positioned above or below the via. According to the present invention, the interconnect is checked by using different parameters depending on whether the interconnect to be checked is positioned above or below the via.

In the above embodiment, an interconnect is designed based on an allowable current depending on the positional relationship between the interconnect and a via. Alternatively, all capacitances (C) ancillary to an interconnect are represented by a single capacitance (equivalent capacitance), and a current value is determined by capacitance×frequency×power supply voltage. Since the operating frequency and the power supply voltage are given, a maximum capacitance value may be used as a design reference instead of an allowable current value. That is, a current limitation may be replaced with a capacitance limitation.

In the above embodiment, an interconnect is made of Cu or a Cu alloy containing Cu as a main conductive material. However, an interconnect may be made of silver (Ag) or gold (Au).

The present invention offers a first advantage in that the life of an interconnect can accurately be recognized in view of different interconnect lives depending on whether a void can easily be formed or not, and the interconnect can be designed without unduly limiting an allowable current therefor. This is because the life of the interconnect governed by an electromigration is predicted by using different predicting models that are classified according to a void incubation period and a void growth period of a void that occurs in the vicinity of a junction between the interconnect and a via which connects upper and lower interconnect, and a semiconductor device having a multilayer interconnect structure is designed for its interconnect based on the predicted life.

The present invention offers a second advantage in that a process of checking an interconnect can be carried out when the interconnect is designed by the above process of designing the interconnect.

While a preferred embodiment of the present invention has been described using specific terms, such description is for illustrative purposes only, and it is to be interconnect that changes and variations may be made without departing from the spirit or scope of the following claims.

What is claimed is:

1. A method of designing an interconnect of a semiconductor device having a multilayer interconnect structure, comprising the steps of predicting the life of the interconnect governed by an electromigration with different predicting models that are classified according to a void incubation period and a void growth period of a void that occurs in the vicinity of a junction between the interconnect and a via which connects upper and lower interconnect, and designing the interconnect based on the predicted life.

2. A method according to claim 1, wherein the different predicting models are classified according to whether the interconnect with the void is positioned above or below said via.

3. A method according to claim 1, wherein the different predicting models handle the void incubation period and the void growth period independently of each other.

4. A method according to claim 2, wherein one of said different predicting models is formed with an allowable current based on said void incubation period if the interconnect with the void is positioned below said via.

5. A method according to claim 4, wherein said allowable current is smaller than an allowable current applied in case that the interconnect with the void is positioned above said via.

6. A method according to claim 2, wherein one of said different predicting models is formed with an allowable current based on the sum of said void incubation period and said void growth period if the interconnect with the void is positioned above said via.

7. A method according to claim 6, wherein said allowable current is greater than an allowable current applied in case that the interconnect with the void is positioned below said via.

8. A method according to claim 4, wherein a capacitance equivalent to all capacitances ancillary to the interconnect is used instead of said allowable current.

9. A method according to claim 5, wherein a capacitance equivalent to all capacitances ancillary to the interconnect is used instead of said allowable current.

10. A method according to claim 6, wherein a capacitance equivalent to all capacitances ancillary to the interconnect is used instead of said allowable current.

11. A method according to claim 7, wherein a capacitance equivalent to all capacitances ancillary to the interconnect is used instead of said allowable current.

12. A method according to claim 1, wherein said interconnect is made of a Cu alloy containing Cu as a main conductive material.

13. A method according to claim 1, wherein said interconnect is formed according to a damascene process.

14. A method of checking an interconnect for an electromigration with a design reliability verifying CAD tool when the interconnect is designed by a method according to claim 1, comprising the step of changing a checking process depending on whether the interconnect for producing a void is positioned above or below a via which connects upper and lower interconnect.

15. A method according to claim 14, wherein the interconnect is checked by using a parameter above the via based on an allowable current for the interconnect if the interconnect with the void is positioned above the via, and the interconnect is checked by using a parameter below the via based on an allowable current for the interconnect if the interconnect with the void is positioned below the via.

* * * * *